United States Patent
Toko et al.

(10) Patent No.: US 11,502,125 B2
(45) Date of Patent: Nov. 15, 2022

(54) MAGNETORESISTIVE MEMORY DEVICE

(71) Applicant: KIOXIA CORPORATION, Tokyo (JP)

(72) Inventors: Masaru Toko, Kawasaki Kanagawa (JP); Tadaomi Daibou, Yokkaichi Mie (JP); Junichi Ito, Yokohama Kanagawa (JP); Taichi Igarashi, Kawasaki Kanagawa (JP); Tadashi Kai, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 321 days.

(21) Appl. No.: 16/816,775

(22) Filed: Mar. 12, 2020

(65) Prior Publication Data
US 2021/0082999 A1 Mar. 18, 2021

(30) Foreign Application Priority Data

Sep. 12, 2019 (JP) .............................. JP2019-166294

(51) Int. Cl.
*H01L 27/22* (2006.01)
*H01L 43/10* (2006.01)
(Continued)

(52) U.S. Cl.
CPC .......... *H01L 27/224* (2013.01); *G11C 11/161* (2013.01); *G11C 11/1659* (2013.01);
(Continued)

(58) Field of Classification Search
CPC ....... H01L 27/224; H01L 43/02; H01L 43/10; H01L 43/12; G11C 11/161; G11C 11/1659
(Continued)

(56) References Cited

U.S. PATENT DOCUMENTS

| 10,446,211 B2 | 10/2019 | Maekawa | |
|---|---|---|---|
| 2006/0237808 A1* | 10/2006 | Saito | G11C 11/16 |
| | | | 257/E27.005 |

(Continued)

FOREIGN PATENT DOCUMENTS

| JP | 4226679 B2 * | 2/2009 |
|---|---|---|
| JP | 2013069865 A | 4/2013 |

(Continued)

OTHER PUBLICATIONS

U.S. Appl. No. 16/816,961; First Named Inventor: Kazuya Sawada; Title: Magnetic Memory Device, filed Mar. 12, 2020.

*Primary Examiner* — Jami Valentine Miller
(74) *Attorney, Agent, or Firm* — Holtz, Holtz & Volek PC

(57) ABSTRACT

A magnetoresistive memory device according to one embodiment includes: first and second layer stacks, each of which includes: a first ferromagnetic layer having a magnetization directed in a first direction; a non-magnetic first conductive layer above the first ferromagnetic layer, a second ferromagnetic layer provided above the first conductive layer and having a magnetization directed in a second direction different from the first direction, a first insulating layer on an upper surface of the second ferromagnetic layer, and a third ferromagnetic layer above the first insulating layer. The second ferromagnetic layer of the second layer stack is thicker than the second ferromagnetic layer of the first layer stack.

17 Claims, 8 Drawing Sheets

(51) Int. Cl.
  *G11C 11/16* (2006.01)
  *H01L 43/02* (2006.01)
  *H01L 43/12* (2006.01)
(52) U.S. Cl.
  CPC .............. *H01L 43/02* (2013.01); *H01L 43/10* (2013.01); *H01L 43/12* (2013.01)
(58) Field of Classification Search
  USPC ........................................................ 257/421
  See application file for complete search history.

(56) References Cited

U.S. PATENT DOCUMENTS

| | | | | |
|---|---|---|---|---|
| 2008/0197431 | A1* | 8/2008 | Morise | G11C 11/5607 257/E27.005 |
| 2009/0096042 | A1* | 4/2009 | Rizzo | G11C 11/161 257/E29.323 |
| 2016/0380184 | A1* | 12/2016 | Kato | H01L 43/02 257/421 |
| 2016/0380185 | A1* | 12/2016 | Kato | H01L 43/08 257/421 |
| 2017/0178705 | A1* | 6/2017 | Buhrman | H01L 43/065 |
| 2018/0277743 | A1 | 9/2018 | Inaba et al. | |
| 2019/0013460 | A1 | 1/2019 | Ikegawa | |
| 2019/0206932 | A1 | 7/2019 | Kim et al. | |
| 2020/0091227 | A1 | 3/2020 | Iwayama et al. | |
| 2022/0068537 | A1* | 3/2022 | Mizuno | G11B 5/3903 |

FOREIGN PATENT DOCUMENTS

| | | | |
|---|---|---|---|
| JP | 2018163710 A | 10/2018 | |
| JP | 2019057343 A | 4/2019 | |

\* cited by examiner

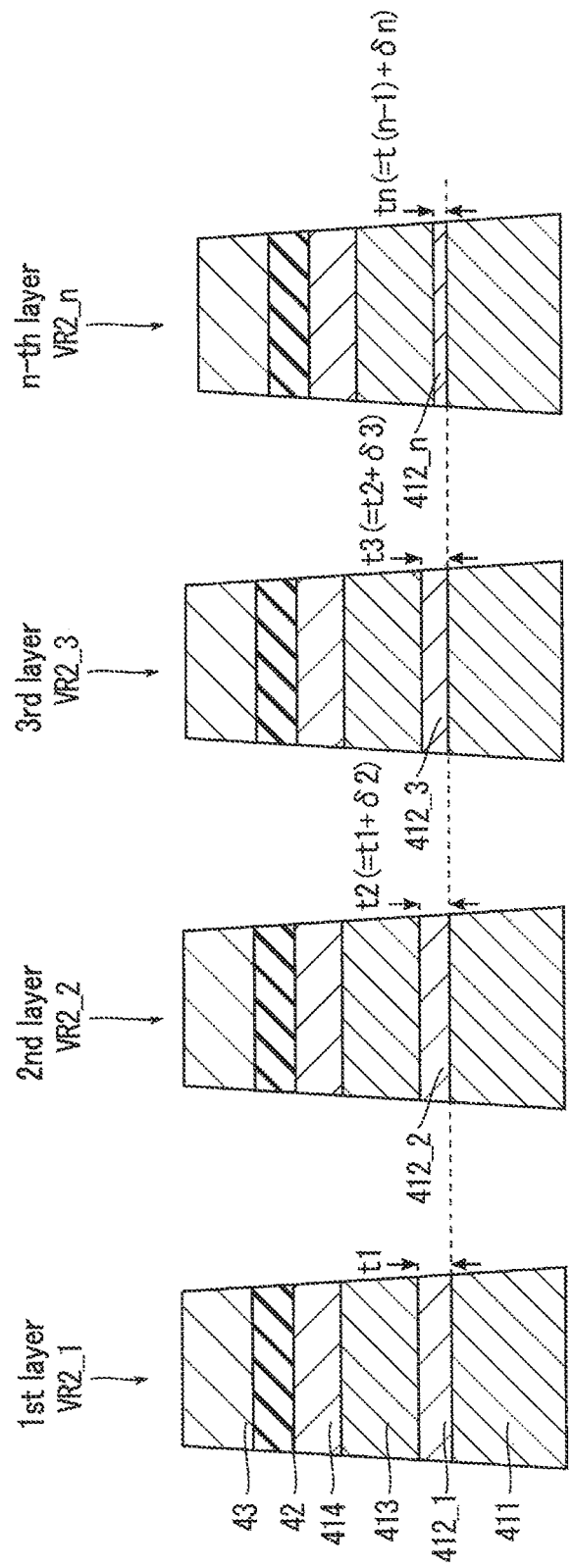
F I G. 9

MAGNETORESISTIVE MEMORY DEVICE

CROSS-REFERENCE TO RELATED APPLICATIONS

This application is based upon and claims the benefit of priority from Japanese Patent Application No. 2019-166294, filed Sep. 12, 2019, the entire contents of which are incorporated herein by reference.

FIELD

Embodiments described herein relate generally to a magnetoresistive memory device.

BACKGROUND

A magnetoresistive memory device capable of storing data using a magnetoresistive effect is known.

BRIEF DESCRIPTION OF THE DRAWINGS

FIG. 9 shows an example of structures of variable resistance elements in respective layers of memory cells, according to a modification of the second embodiment.

DETAILED DESCRIPTION

Figure 1:
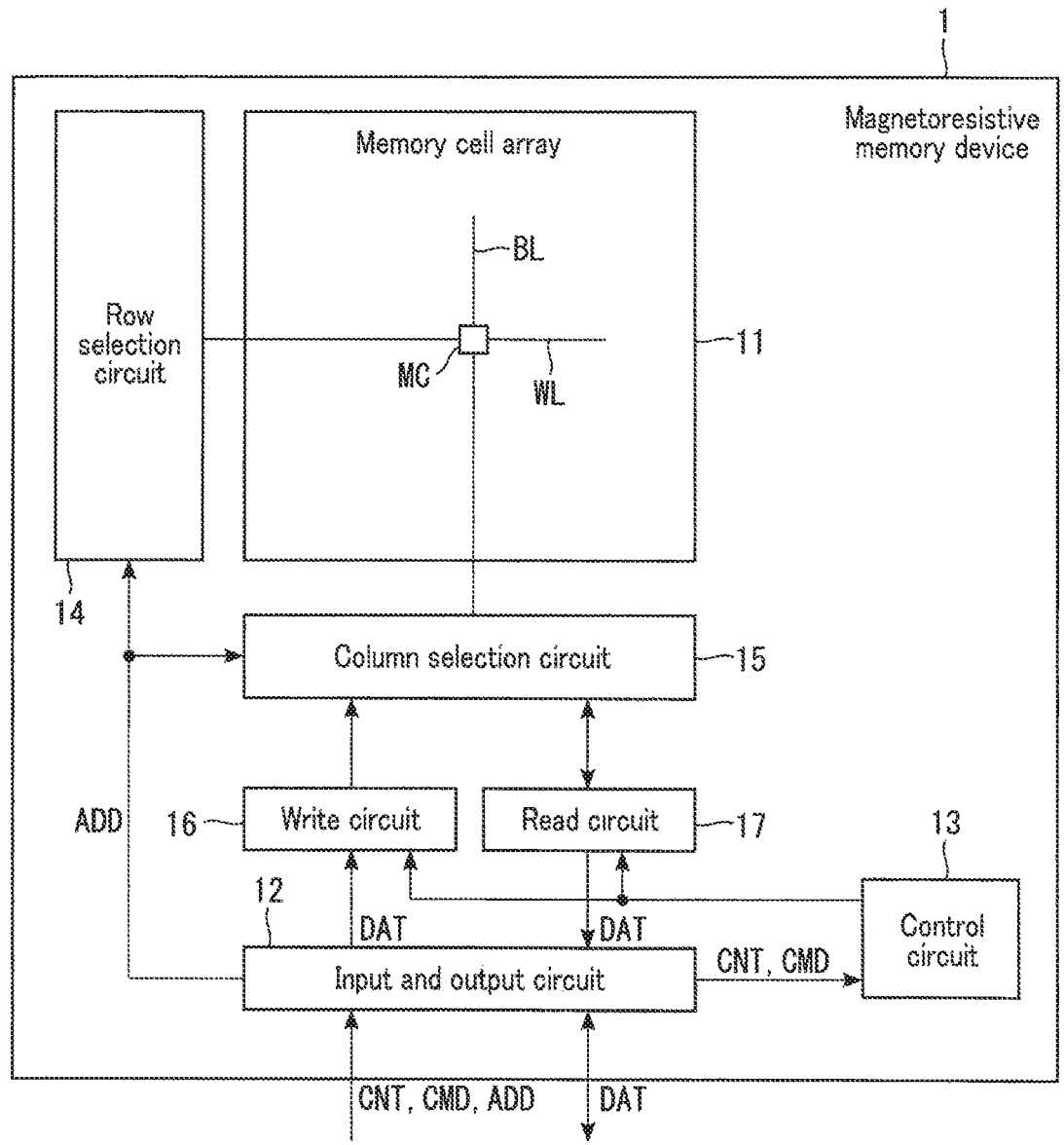
FIG. 1 shows functional blocks of a memory device according to a first embodiment.

In general, according to one embodiment, a magnetoresistive memory device according to one embodiment includes: first and second layer stacks, each of which includes: a first ferromagnetic layer having a magnetization directed in a first direction; a non-magnetic first conductive layer above the first ferromagnetic layer, a second ferromagnetic layer provided above the first conductive layer and having a magnetization directed in a second direction different from the first direction, a first insulating layer on an upper surface of the second ferromagnetic layer, and a third ferromagnetic layer above the first insulating layer. The second ferromagnetic layer of the second layer stack is thicker than the second ferromagnetic layer of the first layer stack.

Embodiments will now be described with reference to the figures. In the following description, components with substantially the same functionalities and configurations will be referred to with the same reference numerals, and repeated descriptions may be omitted.

The figures are schematic, and the relations between the thickness and the area of a plane of a layer and ratios of thicknesses of layers may differ from actual ones. Moreover, the figures may include components which differ in relations and/or ratios of dimensions in different figures. Moreover, the entire description for a particular embodiment also applies to other embodiments unless explicitly mentioned otherwise or obviously eliminated.

In the specification and the claims, a phrase of a particular first component being "coupled" to another second component includes the first component being coupled to the second component either directly or via one or more components which are always or selectively conductive.

The embodiments will be described by using an xyz orthogonal coordinate system. In the description that follows, the term "low" and its derivatives and relevant terms refer to a position with a smaller coordinate on the z axis, and the term "up" and its derivatives and relevant terms refer to a position with a larger coordinate on the z axis.

1. First Embodiment

<1.1. Overall Configuration and Structure of Magnetic Memory Device>

FIG. 1 shows functional blocks of the magnetoresistive memory device according to the first embodiment. As shown in FIG. 1, a magnetoresistive memory device 1 includes a memory cell array 11, an input and output circuit 12, a control circuit 13, a row selection circuit 14, a column selection circuit 15, a write circuit 16, and a read circuit 17.

The memory cell MC can store data in a non-volatile manner. Each memory cell MC is coupled to one word line WL and one bit line BL. Each word line WL is associated with a row. Each bit line BL is associated with a column. Selection of one row and selection of one or more columns specify one or more memory cells MC.

The input and output circuit 12 receives various types of control signals CNT, various types of commands CMD, an address signal ADD, and data (write data) DAT, for example, from a memory controller 2, and transmits data (read data) DAT to, for example, the memory controller 2.

The row selection circuit 14 receives the address signal ADD from the input and output circuit 12, and brings one word line WL associated with the row that is specified by the received address signal ADD into a selected state.

The column selection circuit 15 receives the address signal ADD from the input and output circuit 12 and brings bit lines BL associated with the column that is specified by the received address signal ADD into a selected state.

The control circuit 13 receives the control signal CNT and the command CMD from the input and output circuit 12. The control circuit 13 controls the write circuit 16 and the read circuit 17 based on controls instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the reading of data from the memory cell array 11.

The write circuit 16 receives write data DAT from the input and output circuit 12 and supplies the voltages used for data writing to the column selection circuit 15 based on the control by the control circuit 13 and the write data DAT.

The read circuit 17 includes a sense amplifier, and based on the control of the control circuit 13, uses the voltages used for data reading to determine data stored in the memory cells MC. The determined data is supplied to the input/output circuit 12 as the read data DAT.

<1.2. Circuit Configuration of Memory Cell Array>

Figure 2:
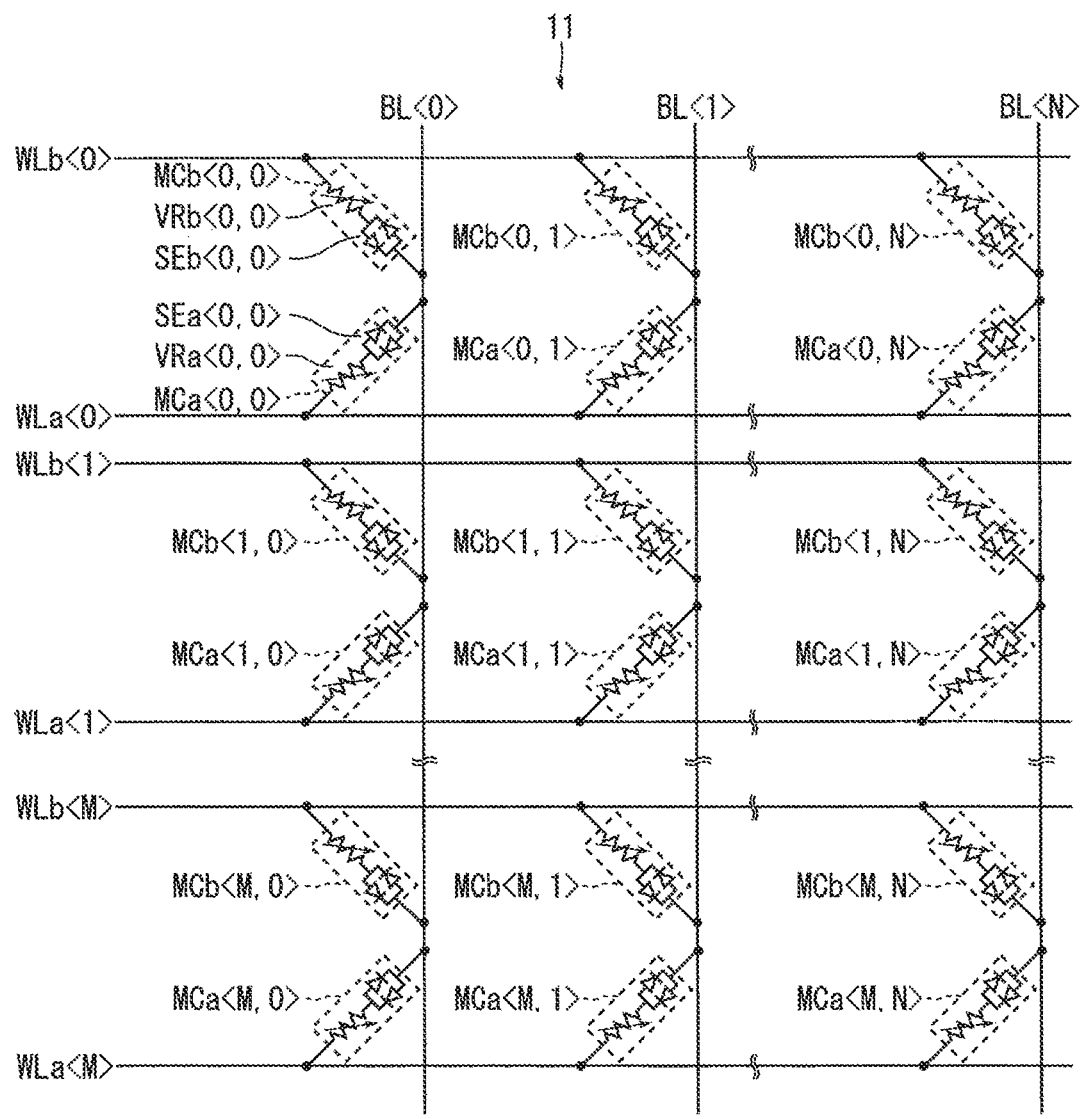
FIG. 2 is a circuit diagram of a memory cell array according to the first embodiment.

FIG. 2 is a circuit diagram of a memory cell array 11 according to the first embodiment. As shown in FIG. 2, the memory cell array 11 includes (M+1) word lines WLa (WLa<0>, WLa<1>, . . . , and WLa<M>) and (M+1) word lines WLb (WLb<0>, WLb<1>, . . . , and WLb<M>), where M is a natural number. The memory cell array 11 also includes (N+1) bit lines BL (BL<0>, BL<1>, . . . , and BL<N>), where N is a natural number.

Each of the memory cells MC (MCa and MCb) includes two nodes: a first node coupled to a single word line WL; and a second node coupled to a single bit line BL. More specifically, the memory cells MCa encompass memory cells MCa<$\alpha$, $\beta$> for all combinations of $\alpha$ and $\beta$, where $\alpha$ is every integer equal to or greater than 0 and equal to or smaller than M, and $\beta$ is every integer equal to or greater than 0 and equal to or smaller than N, and the memory cell MCa<$\alpha$, $\beta$> is coupled between the word line WLa<$\alpha$> and the bit line BL<$\beta$>. Similarly, the memory cells MCb encompass memory cells MCb<$\alpha$, $\beta$>, for all combinations of $\alpha$ and $\beta$, where $\alpha$ is every integer equal to or greater than 0 and equal to or smaller than M, and $\beta$ is every integer equal to or greater than 0 and equal to or smaller than N, and the memory cell MCb<$\alpha$, $\beta$> is coupled between the word line WLb<$\alpha$> and the bit line BL<$\beta$>.

Each memory cell MC includes a single magnetoresistive effect element VR (VRa or VRb) and a single selector SE (SEa or SEb). More specifically, the memory cell MCa<$\alpha$, $\beta$> includes a magnetoresistive effect element VRa<$\alpha$, $\beta$> and a selector SEa<$\alpha$, $\beta$> for all combinations of $\alpha$ and $\beta$, where $\alpha$ is every integer equal to or greater than 0 and equal to or smaller than M, and $\beta$ is every integer equal to or greater than 0 and equal to or smaller than N. Moreover, each memory cell MCb<$\alpha$, $\beta$> includes a magnetoresistive effect element VRb<$\alpha$, $\beta$> and a selector SEb<$\alpha$, $\beta$> for all combinations of $\alpha$ and $\beta$, where $\alpha$ is every integer equal to or greater than 0 and equal to or smaller than M, and $\beta$ is every integer equal to or greater than 0 and equal to or smaller than N.

In each memory cell MC, the magnetoresistive effect element VR and the selector SE are coupled in series. The magnetoresistive effect element VR is coupled to a single word line WL, and the selector SE is coupled to a single bit line BL.

The magnetoresistive effect element VR is capable of switching between a low-resistance state and a high-resistance state. The magnetoresistive effect element VR is capable of storing 1-bit data, utilizing the difference in the two resistance states.

The selector SE includes two terminals. When a voltage smaller than a first threshold is applied in a first direction between the two terminals, the selector SE is in a high-resistance state, i.e., electrically non-conductive (in an off state). On the other hand, when a voltage equal to or greater than a first threshold is applied in the first direction between the two terminals, the selector SE is in a low-resistance state, for example, electrically conductive (in an on state). The selector SE is further equipped with a function similar to the function of switching between the high-resistance state and the low-resistance state based on the magnitude of the voltage applied in the first direction, with respect to a second direction opposite to the first direction. By turning on or off the selector SE, it is possible to perform control as to whether or not to supply a current to a magnetoresistive effect element VR coupled to the selector SE, namely, whether or not to select the magnetoresistive effect element VR.

<1.3. Structure of Memory Cell Array>

Figure 3:
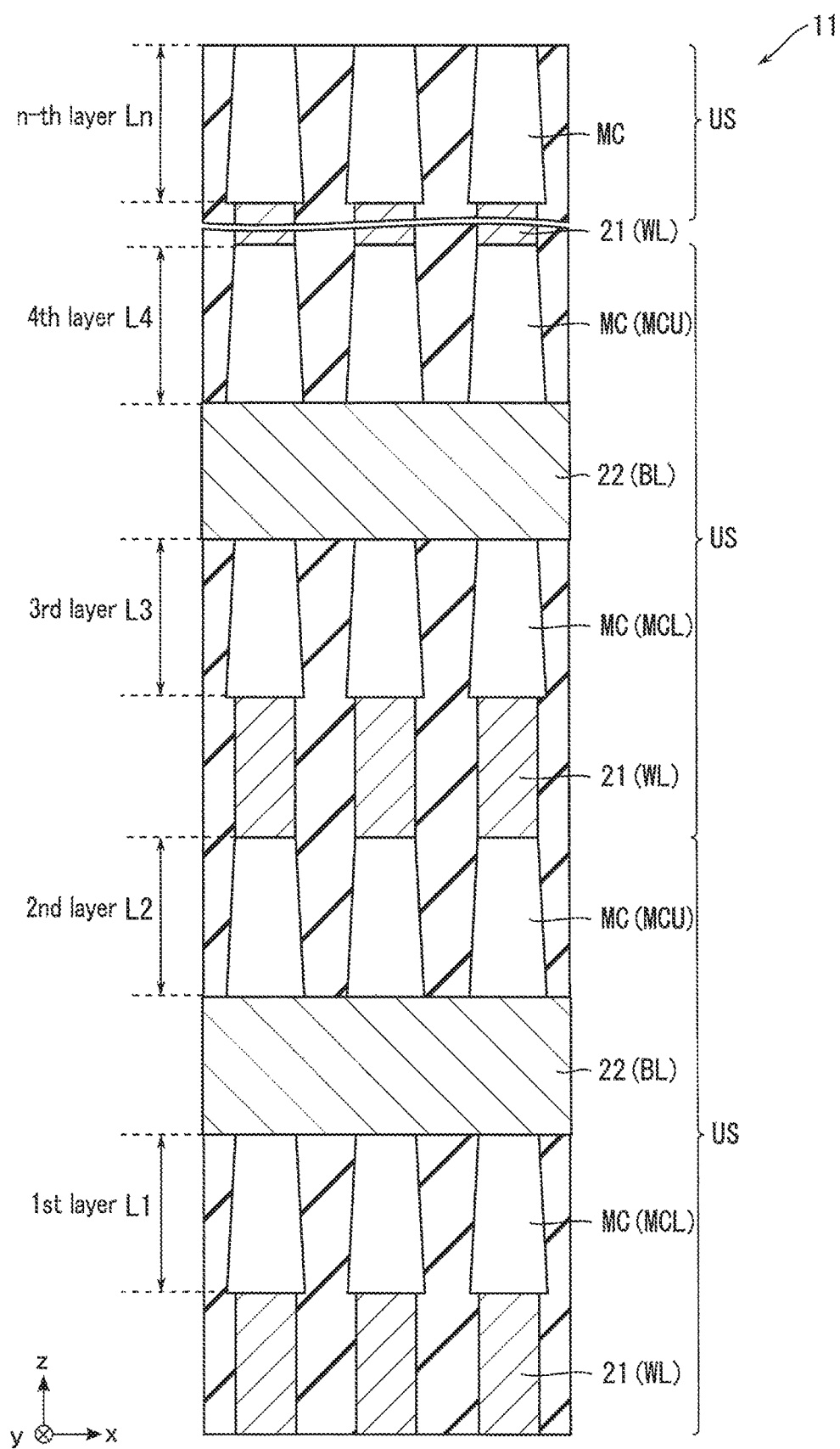
FIG. 3 shows a cross-sectional structure of part of the memory cell array according to the first embodiment.

FIG. 3 shows a cross-sectional structure of part of the memory cell array 11 according to the first embodiment. As shown in FIG. 3, the memory cell array 11 includes a plurality of unit structures US. The unit structures US are provided above a semiconductor substrate (not illustrated) along the z axis. Each unit structure US has the same structure, except for the difference in the thickness of a layer in the unit structure, as will be discussed in detail below. The unit structures US will now be described.

Each unit structure US includes four layers. The four layers include, from lower to upper, a layer of conductors 21, a layer of memory cells MC, a layer of conductors 22, and a layer of memory cells MC.

Each unit structure US includes a plurality of conductors 21 in the lowermost layer. The conductors 21 extend along the y axis, and are arranged along the x axis. Each conductor 21 functions as a single word line WL.

Each unit structure US includes a plurality of memory cells MC in the second layer from the lowermost layer. Each memory cell MC is provided on a top surface of a corresponding conductor 21 in the lowermost layer, has a substantially circular shape as viewed in the xy plane, and has the shape of a conical frustum whose top surface has a smaller area than its bottom surface. The memory cells MC are arranged in, for example, a matrix pattern on the xy plane. That is, some memory cells MC are arranged along the x axis to constitute a plurality of rows, and some memory cells MC are arranged along the y axis on the top surfaces of the conductors 21 to constitute a plurality of rows. The memory cells MC in the second layer from the lowermost layer may be referred to as "lower memory cells MCL", in distinction from the memory cells MC in the uppermost layer.

Each unit structure US includes a plurality of conductors 22 in the third layer from the lowermost layer. The conductors 22 extend along the x axis, and are arranged along the y axis. Each conductor 22 is, at its bottom surfaces, coupled to top surfaces of some lower memory cells MCL arranged along the x axis. With such a structure, each of the lower memory cells MCL is coupled to, at its bottom surface, a top surface of a single conductor 21, and is also coupled to, at its top surface, a single conductor 22. Each conductor 22 functions as a single bit line.

Each unit structure US includes a plurality of memory cells MC in the uppermost layer. Hereinafter, the memory cells MC in the uppermost layer may be referred to as "upper memory cells MCU", in distinction from the memory cells MC in the second layer from the lowermost layer. The upper memory cells MCU are arrayed in a matrix pattern on the xy plane, similarly to the lower memory cells MCL. That is, some upper memory cells MCU are arranged along the conductors 22 and along the x axis, and are coupled, at their bottom surfaces, to top surfaces of a single conductor 22. The upper memory cells MCU are arranged along the y axis.

The above-described unit structure US is repeatedly provided along the z axis. Each unit structure US is, at its top surface and/or bottom surface, coupled to another unit structure US. That is, each conductor 21 in a first unit structure US is, at its bottom surface, coupled to respective top surfaces of upper memory cells MCU arranged along the y axis in a second unit structure US. With such a structure, each of the upper memory cells MCU is coupled to, at its bottom surface, only one of conductors 22, and is also coupled to, at its top surface, only one of conductors 21.

Since a plurality of unit structures US are provided, as described above, the memory cell array 11 includes a plurality of layers of memory cells MC. Hereinafter, the layers of the memory cells MC will be referred to as, in order from lower (a position with a smaller coordinate on the z axis) to upper (a position with a larger coordinate on the z axis), a "first layer L1", a "second layer L2", a "third layer L3", and a "fourth layer L4", . . . . As an example, the memory cell array 11 includes n layers L, namely, a first layer L1 to an n-th layer Ln.

The memory cell array 11 further includes interlayer insulators in regions in which the conductors 21 and 22 and the memory cells MC are not provided.

<1.3.1. Structure of Memory Cell>

Figure 4:
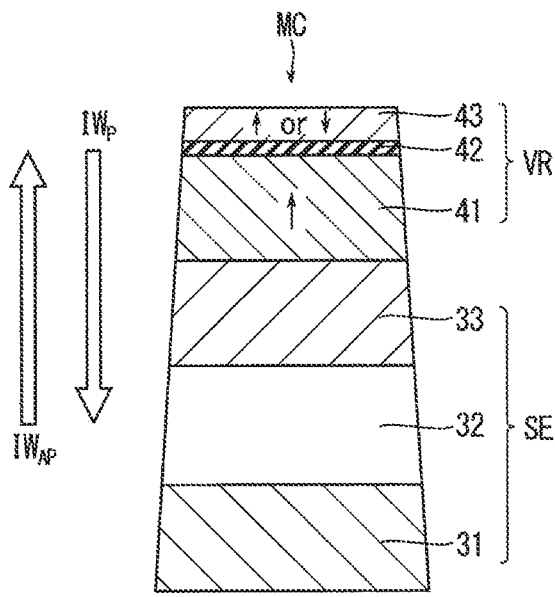
FIG. 4 shows an example of a detailed structure of a memory cell according to the first embodiment.

FIG. 4 shows an example of a detailed structure of a memory cell MC according to the first embodiment. As shown in FIG. 4, each memory cell MC includes a layer stack which functions as a selector SE, and a layer stack which functions as a magnetoresistive effect element VR.

The selector SE includes a variable resistance material 32. The selector SE may further include a lower electrode 31 and an upper electrode 33. FIG. 4 and the description given below are based on this example. The lower electrode 31 is positioned at a portion of the selector SE including its bottom surface, and the upper electrode 33 is positioned at a portion of the selector SE including its top surface. The variable resistance material 32 is positioned between the lower electrode 31 and the upper electrode 33. As an example, the variable resistance material 32 is, at its bottom surface, in contact with a top surface of the lower electrode 31, and the variable resistance material 32 is, at its top surface, in contact with a bottom surface of the upper electrode 33.

The variable resistance material 32 (selector SE) is, for example, a switching element between two terminals: a first terminal corresponding to one of the top and bottom surfaces of the variable resistance material 32; and a second terminal corresponding to the other of the top and bottom surfaces of the variable resistance material 32. If a voltage to be applied between the two terminals is smaller than a threshold value, the switching element is in a "high-resistance" state, e.g., in an electrically non-conductive state. If a voltage to be applied between the two terminals is equal to or greater than a threshold value, the switching element is in a "low-resistance" state, e.g., in an electrically conductive state.

The magnetoresistive effect element VR exhibits a tunnel magnetoresistive effect, and includes a magnetic tunnel junction (MTJ). Specifically, the magnetoresistive effect element VR includes a ferromagnet 41, an insulator 42, and a ferromagnet 43. The ferromagnet 41, the insulator 42, and the ferromagnet 43 are, for example, in a layered shape spreading along the xy plane. The insulator 42 is provided between the ferromagnet 41 and the ferromagnet 43. In one example, the ferromagnet 41 is positioned on a top surface of the upper electrode 33 at a portion of the magnetoresistive effect element VR including its bottom surface, and the ferromagnet 43 is positioned at a portion of the magnetoresistive effect element VR including its top surface. In another example, the insulator 42 is positioned on a top surface of the ferromagnet 41, and the ferromagnet 43 is positioned on a top surface of the insulator 42. The description given below and the drawings to which reference will be made are based on these examples.

The ferromagnet 41 has a synthetic antiferromagnetic (SAF) structure. To this end the ferromagnet 41 includes a structure in which a plurality of magnets and conductors are stacked. A detailed structure of the ferromagnet 41 will be described in detail later. The ferromagnet 41 has an easy axis of magnetization (indicated by the arrow) along a direction penetrating interfaces of the ferromagnet 41, the insulator 42, and the ferromagnet 43, e.g., along the direction orthogonal to the interfaces. The direction of magnetization of the ferromagnet 41 is designed not to be varied by data reading or writing in the magnetoresistive memory device 1. The ferromagnet 41 can function as what is known as a reference layer. The ferromagnet 41 includes a ferromagnet 414 (not illustrated) which is at a position in contact with the insulator 42, and a ferromagnet 413 (not illustrated) which is in contact with the ferromagnet 411, and the magnetization of the ferromagnet 41 refers to the magnetization of the ferromagnets 414 and 413.

The insulator 42 contains or consists of an insulator, such as magnesium oxide (MgO).

The ferromagnet 43 contains or consists of, for example, cobalt iron boron (CoFeB) or iron boron (FeB). The ferromagnet 43 has an easy axis of magnetization (indicated by the arrows) along a direction penetrating interfaces of the ferromagnet 41, the insulator 42, and the ferromagnet 43, e.g., along the direction orthogonal to the interfaces. The direction of magnetization of the ferromagnet 43 may be varied by data writing, and the ferromagnet 43 can function as what is known as a storage layer.

Of two states with different resistance values, the magnetoresistive effect element VR is in a state with a lower resistance value when the direction of magnetization of the ferromagnet 43 is parallel to the direction of magnetization of the ferromagnet 41. Of the two states with different resistance values, the magnetoresistive effect element VR is in a state with a higher resistance value when the direction of magnetization of the ferromagnet 43 is antiparallel to the direction of magnetization of the ferromagnet 41.

For data reading, it is determined, for example, which of the two resistance states a magnetoresistive effect element VR of a memory cell MC to be a read target is in, using a read current flowing through the memory cell MC to be the data read target.

When a write current $IW_P$ flows from the ferromagnet 43 toward the ferromagnet 41, the direction of magnetization of the ferromagnet 43 becomes parallel to the direction of magnetization of the ferromagnet 41. On the other hand, when a write current $IW_{AP}$ flows from the ferromagnet 41 toward the ferromagnet 43, the direction of magnetization of the ferromagnet 43 becomes antiparallel to the direction of magnetization of the ferromagnet 41. Hereinafter, the write currents $IW_P$ and $IW_{AP}$ will be collectively referred to as a "write current IW" when they need not be distinguished from each other, and a description about the write current IW applies to both of the write currents $IW_P$ and the $IW_{AP}$.

The memory cell MC may include an additional layer of a material. Such a layer includes a cap layer. The cap layer is positioned on a top surface of the magnetoresistive effect element VR.

<1.3.2. Detailed Structure of Ferromagnet 41>

Figure 5:
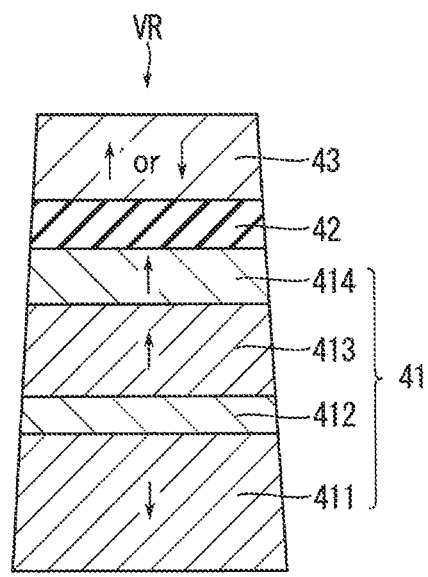
FIG. 5 shows an example of a detailed structure of a magnetoresistive effect element according to the first embodiment.

FIG. 5 shows an example of a detailed structure of the magnetoresistive effect element VR according to the first embodiment, and in particular, an example of a detailed structure of the ferromagnet 41.

The ferromagnet 41 includes a ferromagnet 411, a conductor 412, a ferromagnet 413, and a ferromagnet 414. The ferromagnet 411, the conductor 412, the ferromagnet 413, and the ferromagnet 414 are, in this order, stacked upward along the z axis. The ferromagnet 411, the conductor 412, the ferromagnet 413, and the ferromagnet 414 are, for example, in a layered shape extending along the xy plane.

The ferromagnet 411 contains or consists of, for example, cobalt platinum (CoPt), cobalt nickel (CoNi), or cobalt palladium (CoPd). The ferromagnet 411 has an easy axis of magnetization (indicated by the arrows) along a direction penetrating interfaces of the ferromagnets 411, 413, and 414 and the conductor 412, e.g., along the direction orthogonal to the interfaces. The ferromagnet 411 suppresses a magnetic field (or, stray field) generated by the ferromagnets 413 and 414 and applied to the ferromagnet 43.

The conductor 412 is nonmagnetic, and contains or consists of, for example, ruthenium (Ru) or iridium (Ir). The conductor 412 causes antiferromagnetic exchange coupling between the ferromagnet 411 and the ferromagnet 413. Each of Ru and Ir causes two magnets sandwiching the layer of Ru or Ir to be coupled magnetically or antiferromagnetically, depending on the thickness of Ru or Ir. The conductor 412 has a thickness that causes antiferromagnetic coupling between the ferromagnet 411 and the ferromagnet 413. The conductor 412 may further include a layer of Pt and/or Pd. The conductor 412 has a thickness determined based on which of the first layer L1 to the n-th layer Ln the conductor 412 is included in. The respective conductors 412 in the first layer L1 to the n-th layer Ln have different thicknesses, as will be discussed later. The conductor 412 has, for example, a thickness equal to or greater than 0.2 nm and equal to or smaller than 0.8 nm.

The ferromagnet 413 contains or consists of, for example, CoFeB or FeB. The ferromagnets 411, 413, and 414 have an easy axis of magnetization (indicated by the arrows) along a direction penetrating interfaces of the ferromagnets 411, 413, and 414, and the conductor 412, e.g., along the direction orthogonal to the interfaces. Since the ferromagnets 411 and 413 are antiferromagnetically coupled, as described above, the ferromagnet 413 has a direction of magnetization opposite to the direction of magnetization of the ferromagnet 411.

The ferromagnet 414 contains or consists of, for example, CoFeB or FeB. The ferromagnet 414 has an easy axis of magnetization (indicated by the arrows) along a direction penetrating interfaces of the ferromagnets 411, 413, and 414 and the conductor 412, e.g., along the direction orthogonal to the interfaces. The direction of magnetization of the ferromagnet 414 is maintained by the magnetization of the ferromagnet 413, and therefore has a direction identical to the direction of magnetization of the ferromagnet 413. The ferromagnet 414 contains, for example, the same element as the ferromagnet 413, and has a crystal structure different from the ferromagnet 413. The ferromagnet 414 has, for example, a thickness equal to or greater than 0.8 nm and equal to or smaller than 1.4 nm.

<1.3.3. Details of Thickness of Layer of Ferromagnet 414>

Figure 6:
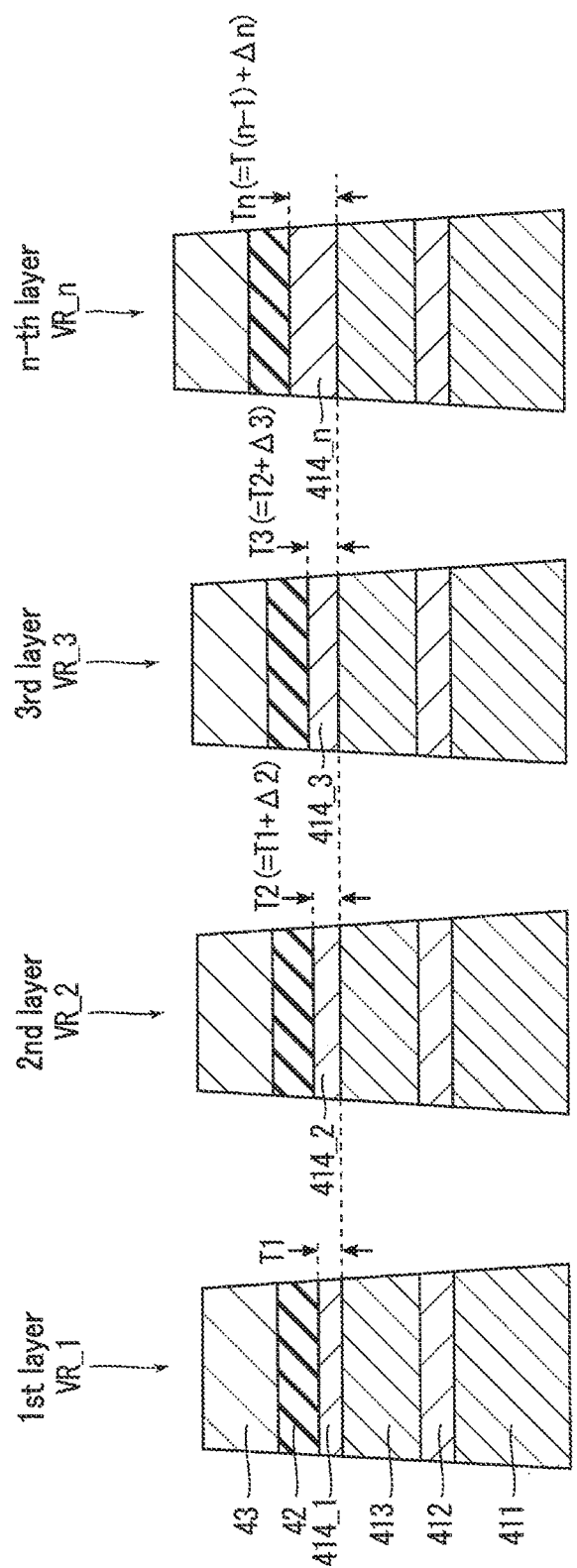
FIG. 6 shows an example of structures of variable resistance elements in respective layers of memory cells, according to the first embodiment.

FIG. 6 shows an example of structures of magnetoresistive effect elements VR in the respective layers of memory cells, according to the first embodiment.

As described above, the memory cell array 11 includes the first layer L1 to the n-th layer Ln of the memory cells MC. The magnetoresistive effect element VR of each of the memory cells MC in the first layer L1 may be referred to as a "magnetoresistive effect element VR_1". Similarly, the magnetoresistive effect element VR of each of the memory cells MC in the γ-th layer Lγ may be referred to as "magnetoresistive effect element VR_γ" for all cases of γ, where γ is every natural number equal to or greater than 2 and equal to or smaller than n.

The ferromagnets 414 in the magnetoresistive effect elements VR_1 to VR_n may be respectively referred to as "ferromagnets 414_1 to 414_$n$". The ferromagnet 414_γ has a thickness Tγ, where γ is any natural number equal to or greater than 2 and equal to or smaller than n.

The ferromagnets 414_1 to 414_$n$ have thicknesses such that the ferromagnet 414_γ is thicker for a larger value of γ. That is, thickness Tγ> thickness T(γ−1) is satisfied for all cases of γ, where γ is every natural number equal to or greater than 2 and equal to or smaller than n. The thickness T2 is T1+Δ2; similarly, the thickness Tγ is T(γ−1)+Δγ for all cases of γ, where γ is every natural number equal to or greater than 2 and equal to or smaller than n. The differences Δ2 to Δn may be different from each other, and two or more of the differences Δ2 to Δn may be of the same magnitude. Hereinafter, the differences Δ2 to Δn will be collectively referred to simply as a difference Δ when they need not be distinguished from one another, and a description about the difference Δ applies to all of Δ2 to Δn.

The difference Δ will now be described. In the memory cell array 11, layers are sequentially formed from the lowermost layer. The manufacturing of the magnetoresistive memory device 1 includes thermal treatments of a structure in the course of manufacturing before completion of the magnetoresistive memory device 1. In such a thermal treatment, components already formed at the time of the thermal treatment are heated. Specifically, in a thermal treatment performed during formation of the second layer L2, components in the first layer L1 are also heated. Thermal treatments are required in a variety of steps; however, some of the properties of components already formed at the time of the thermal treatments may be deteriorated. In particular, heating of a magnetoresistive effect element VR already formed by a thermal treatment may deteriorate the magnetic properties of the magnetoresistive effect element VR. A magnetoresistive effect element VR positioned in a lower layer is subjected to a larger number of times of thermal treatment, and its magnetic properties may be further deteriorated.

The magnetic properties that are deteriorated by the accumulation of thermal treatments include data writing properties of the magnetoresistive effect elements VR. The direction of magnetization of the ferromagnet 41 is intended not to vary by data reading or writing as described above, and is required not to vary by a write current IW flowing through the ferromagnet 41. However, with the magnetic properties deteriorated by the accumulation of thermal treatments of the magnetoresistive effect element VR, the write current IW flowing through the magnetoresistive effect element VR is likely to cause an unintended switching in the direction of magnetization of the ferromagnet 414, which in turn is likely to cause an unintended switching in the direction of magnetization of the ferromagnet 413. Such a magnetoresistive effect element VR cannot be used as a memory cell MC.

The differences Δ are selected taking the above-described phenomenon into account. The direction of magnetization of the ferromagnet 414 is maintained by the magnetization of the ferromagnet 413, and the direction of magnetization of the ferromagnet 413 is intended not to vary (i.e., be fixed), using exchange coupling between the ferromagnet 413 and the ferromagnet 411 via the conductor 412. Thus, the direction of magnetization of the ferromagnet 414 having a smaller thickness is more likely to be maintained, and is less likely to be switched, which in turn allows the direction of magnetization of the ferromagnet 413 to be less likely to be switched. Taking into account the possible deterioration, a ferromagnet 414 in a lower layer, which is subjected to a larger number of times of thermal treatment, is likely to have its magnetic properties further deteriorated, and therefore has a smaller thickness. For example, the thicknesses T1 to Tn may be determined, based on experiments and the number of layers L of memory cells MC, to have properties required for the magnetoresistive effect elements VR of the completed magnetoresistive memory device 1, e.g., magnetic properties of not switching the direction of magnetization of the ferromagnets 413 and 414 even when, for example, a write current is supplied.

The magnetic properties deteriorated by the accumulation of thermal treatments also include the magnetoresistance (MR) ratio of the magnetoresistive effect elements VR.

<1.4. Advantages>

According to the first embodiment, a magnetoresistive memory device 1 including magnetoresistive effect elements VR with excellent magnetic properties can be provided, as will be described below.

When a plurality of layers of memory cells MC arranged along the z axis as shown in FIG. 3 are provided, as shown in FIG. 3, a structure may be adopted in which all the ferromagnets 414 of the respective layers of the memory cells MC have the same thickness. For formation of such a structure, thermal treatment needs to be performed multiple times in the course of the formation. Thus, a magnetoresistive effect element VR positioned in a lower layer is subjected to a larger number of times of thermal treatment in the course of the formation, and may be further deteriorated in its magnetic properties, as described with reference to FIG. 6. When the ferromagnets 414 in different layers have the same thickness, even if the magnetoresistive effect element VR of one of the layers maintains magnetic properties required for the completed magnetoresistive memory device, the magnetoresistive effect element VR in a layer below this layer may not have the required magnetic properties. This may prevent realization of a larger number of layers of memory cells MC for improvement in the storage capacity of the magnetoresistive memory device 1.

According to the first embodiment, a ferromagnet 414 in a magnetoresistive effect element VR in an upper layer has a larger thickness. The direction of magnetization of a ferromagnet 414 having a smaller thickness is more strongly maintained, and is therefore less likely to be switched. Such a ferromagnet 414 having a smaller thickness is more likely to maintain the required magnetic properties, even if its magnetic properties are deteriorated by thermal treatments performed after the formation of the ferromagnet 414. That is, a magnetoresistive effect element VR including a ferromagnet 414 having a smaller thickness has a higher tolerance for the deterioration of its magnetic properties. Thus a magnetoresistive effect element VR with reduced deterioration in its magnetic properties can be formed. This further enables realization of a larger number of memory cells MC, allowing for realization of a magnetoresistive memory device 1 with a larger capacity. Furthermore, by forming the magnetoresistive effect elements VR in the respective layers to have magnetic properties that are correspondingly high enough to compensate for the amount of deterioration to be caused in the subsequent thermal treatments, the properties of the magnetoresistive effect elements VR of the first layer L1 to the n-th layer Ln, which have been deteriorated in magnetic properties, become consistent. This allows magnetoresistive effect elements VR having magnetic properties with reduced dependency on layers to be formed in multiple layers. This allows for realization of a magnetoresistive memory device 1 with reduced variation in magnetic properties of magnetoresistive effect elements VR.

2. Second Embodiment

The second embodiment is different from the first embodiment in terms of components whose thicknesses vary depending on the position.

<2.1. Structure>

In the first embodiment, the ferromagnets 414 in different layers L of memory cells MC have different thicknesses, in order to increase the tolerance for deterioration in magnetic properties caused by accumulation of thermal treatments. In the second embodiment, on the other hand, conductors 412 in different layers L of memory cells MC have different thicknesses. The other features of the magnetoresistive memory device 1 according to the second embodiment are the same as those of the magnetoresistive memory device 1 according to the first embodiment.

Figure 7:
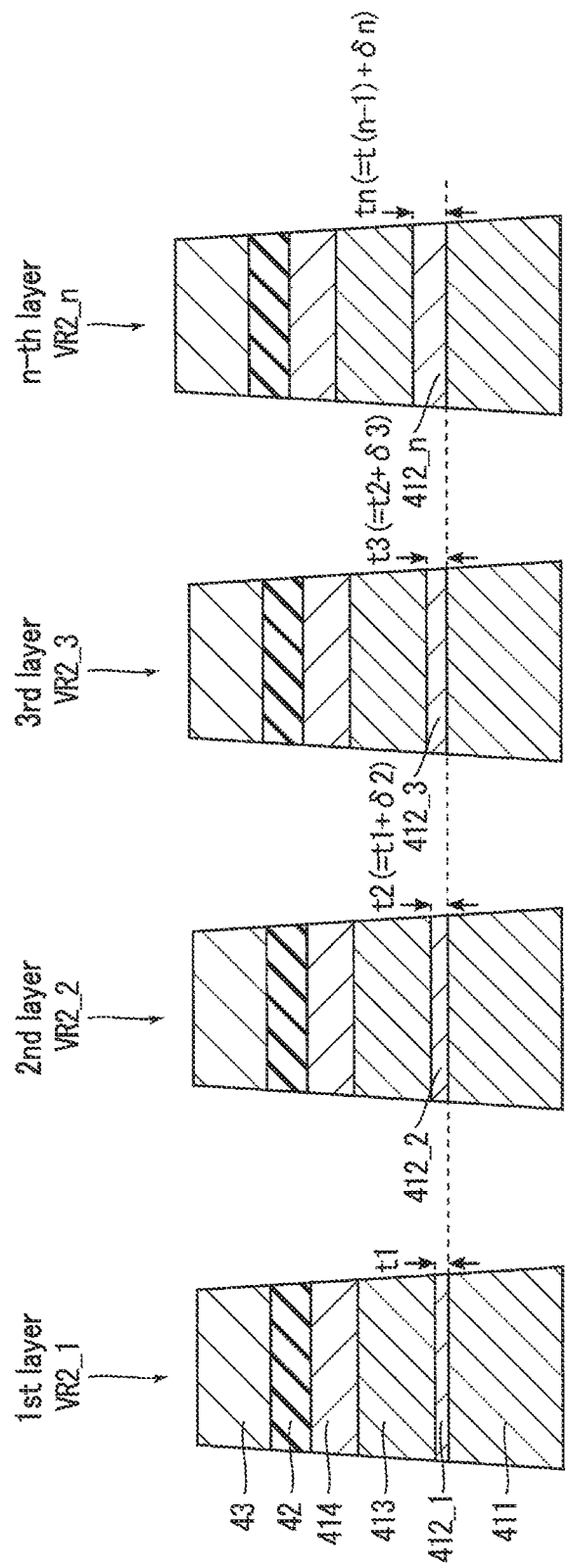
FIG. 7 shows an example of structures of variable resistance elements in respective layers of memory cells, according to a second embodiment.

FIG. 7 shows an example of structures of magnetoresistive effect elements VR in the respective layers of memory cells, according to the second embodiment. The magnetoresistive effect element VR of the second embodiment may be referred to as a "magnetoresistive effect element VR2" in distinction from that of the first embodiment. The magnetoresistive effect element VR2 of each of the memory cells MC in the $\gamma$-th layer L$\gamma$ may be referred to as a "magnetoresistive effect element VR2_$\gamma$".

The conductors 412 in the magnetoresistive effect elements VR2_1 to VR2_$n$ may be respectively referred to as "conductors 412_1 to 412_$n$". The conductor 412_$\gamma$ has a thickness t$\gamma$ for all cases of $\gamma$, where $\gamma$ is every natural number equal to or greater than 2 and equal to or smaller than n. The thickness t$\gamma$ falls within the range from 0.2 nm to 0.8 nm.

Figure 8:
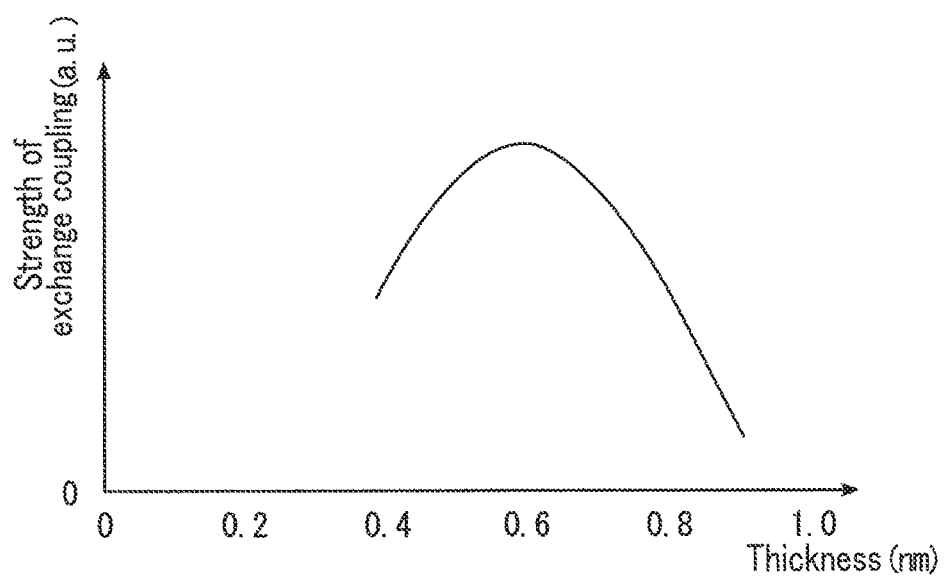
FIG. 8 shows a relationship between the thickness of iridium and the strength of exchange coupling.

The conductor 412 is intended to cause antiferromagnetic exchange coupling between the ferromagnet 411 and the ferromagnet 413 as described above, and includes a material that enables such coupling. Examples of such a material include Ru and Ir described above. As shown in FIG. 8, a curve showing the strength of exchange coupling of a material used as the ferromagnet 411, such as Ru and Ir, with respect to the varying thickness, has one or more local maximum points. The smaller or larger the thickness of the ferromagnet 411 relative to the thickness of the ferromagnet 411 at which the strength of exchange coupling reaches a local maximum point, the lower the strength of exchange coupling. Using this feature, the thicknesses of the conductors 412_1 to 412_$n$ are selected. Details are as follows.

As shown in FIG. 7, the conductors 412_1 to 412_$n$ have thicknesses such that the conductor 412_$\gamma$ is thicker for larger value of $\gamma$, within the range of thicknesses at which the strength of exchange coupling monotonically decreases with the increasing thickness of the conductor 412. That is, t$\gamma$>t($\gamma$−1) is satisfied for all cases of $\gamma$, where $\gamma$ is every natural number equal to or greater than 2 and equal to or smaller than n. The thickness t2 is t1+$\delta$2; similarly, the thickness t$\gamma$ is T($\gamma$−1)+$\delta\gamma$ for all cases of $\gamma$, where $\gamma$ is every natural number equal to or greater than 2 and equal to or smaller than n. All the differences $\delta$2 to $\delta\gamma$ have positive values. The differences $\delta$2 to $\delta$n may be different from each other, and two or more of the differences $\delta$2 to $\delta$n may be of the same magnitude.

As an example, the conductor 412_1 has a thickness at which the strength of exchange coupling reaches a local maximum point, and the conductors 412_1 to 412_$n$ increase in thickness in this order.

<2.2. Advantages>

According to the second embodiment, a conductor 412 in a magnetoresistive effect element VR in an upper layer is thicker within the range of thicknesses at which the strength of exchange coupling monotonically decreases with the increasing thickness of the conductor 412. Stronger exchange coupling occurs between ferromagnets 411 and 413 sandwiching a conductor 412 having a smaller thickness. Thus the same advantageous effects as those achieved by the first embodiment can be produced.

<2.3. Modification>

The conductors 412_1 to 412_n may have thicknesses such that the conductor 412_γ is thinner for a larger value of γ, within the range of thicknesses at which the strength of exchange coupling monotonically decreases with the decreasing thickness of the conductor 412. That is, all the differences δ2 to δn may have negative values, as shown in FIG. 9. FIG. 9 shows an example of structures of variable resistance elements in the respective layers of memory cells, according to a modification of the second embodiment. As an example, the conductor 412_1 has a thickness at which the strength of exchange coupling reaches a local maximum point, and the conductors 412_1 to 412_n decrease in thickness in this order.

The modification can also produce the same advantages as those achieved by the first embodiment.

The second embodiment (including its modification) may be combined with the first embodiment.

3. Other Modifications

Embodiments have been described, as an example, with respect to a structure in which a ferromagnet 41, which functions as what is known as a reference layer, is positioned below an insulator 42, and a ferromagnet 43, which functions as what is known as a storage layer, is positioned above the insulator 42 in the magnetoresistive effect element VR. However, the first and second embodiments are not limited to this example. That is, the ferromagnet 43 may be positioned below the insulator 42, and the ferromagnet 41 may be positioned above the insulator 42. In this case, the magnetoresistive effect element VR has a structure in which components included in the magnetoresistive effect element VR are arranged in a vertically inverted order to the order of the arrangement shown in FIG. 5. That is, the ferromagnet 43, the insulator 42, the ferromagnet 414, the ferromagnet 413, the conductor 412, and the ferromagnet 411 are arranged from lower to upper in this order.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device, comprising:
 a first layer stack and a second layer stack,
 wherein:
 each of the first layer stack and the second layer stack includes:
  a first ferromagnetic layer having a magnetization directed in a first direction,
  a non-magnetic first conductive layer above the first ferromagnetic layer,
  a second ferromagnetic layer provided above the non-magnetic first conductive layer and having a magnetization directed in a second direction different from the first direction,
  a first insulating layer on an upper surface of the second ferromagnetic layer, and
  a third ferromagnetic layer above the first insulating layer,
 the second ferromagnetic layer of the second layer stack is thicker than the second ferromagnetic layer of the first layer stack, and
 the second ferromagnetic layer includes:
  a fourth ferromagnetic layer provided between the first insulating layer and the non-magnetic first conductive layer and being in contact with the first insulating layer, and
  a fifth ferromagnetic layer provided between the fourth ferromagnetic layer and the non-magnetic first conductive layer and having a crystal structure different from a crystal structure of the fourth ferromagnetic layer.

2. The device according to claim 1, wherein each of the fourth ferromagnetic layer of the first layer stack and the fourth ferromagnetic layer of the second layer stack has a thickness equal to or greater than 0.8 nm and equal to or smaller than 1.4 nm.

3. The device according to claim 1, wherein a film thickness of the fourth ferromagnetic layer is thinner than a film thickness of the fifth ferromagnetic layer.

4. The device according to claim 1, wherein the first ferromagnetic layer of the first layer stack is antiferromagnetically coupled with the fifth ferromagnetic layer of the first layer stack.

5. A magnetoresistive memory device comprising:
 first to n-th layer stacks, where n is a natural number equal to or greater than 2,
 wherein:
 a X-th layer stack is positioned above a (X-1)-th layer stack for all cases of X, where X is every natural number from 2 to n,
 each of the first to n-th layer stacks includes:
  a first ferromagnetic layer having a magnetization directed in a first direction;
  a non-magnetic first conductive layer above the first ferromagnetic layer,
  a second ferromagnetic layer provided above the non-magnetic first conductive layer and having a magnetization directed in a second direction different from the first direction,
  a first insulating layer on an upper surface of the second ferromagnetic layer, and
  a third ferromagnetic layer above the first insulating layer, and
 for each of all cases of X being 2 to n, the second ferromagnetic layer of the X-th layer stack is thicker than the second ferromagnetic layer of the (X-1)-th layer stack.

6. The device according to claim 5, wherein the second ferromagnetic layer includes:
 a fourth ferromagnetic layer provided between the first insulating layer and the non-magnetic first conductive layer and being in contact with the first insulating layer, and
 a fifth ferromagnetic layer provided between the fourth ferromagnetic layer and the non-magnetic first conductive layer and having a crystal structure different from a crystal structure of the fourth ferromagnetic layer.

7. The device according to claim 6, wherein the fourth ferromagnetic layer of each of the first to n-th layer stacks has a thickness equal to or greater than 0.8 nm and equal to or smaller than 1.4 nm.

8. The device according to claim 6, wherein a film thickness of the fourth ferromagnetic layer is thinner than a film thickness of the fifth ferromagnetic layer.

9. The device according to claim 6, wherein the first ferromagnetic layer of the X-th layer stack is antiferromagnetically coupled with the fifth ferromagnetic layer of the X-th layer stack for all cases of X, where X is every natural number from 2 to n.

10. A magnetoresistive memory device comprising:
a first layer stack and a second layer stack,
wherein:
each of the first layer stack and the second layer stack includes:
   a first ferromagnetic layer having a magnetization directed in a first direction,
   a non-magnetic first conductive layer above the first ferromagnetic layer,
   a second ferromagnetic layer provided above the non-magnetic first conductive layer and having a magnetization directed in a second direction different from the first direction,
   a first insulating layer on an upper surface of the second ferromagnetic layer, and
   a third ferromagnetic layer above the first insulating layer,
the non-magnetic first conductive layer of the second layer stack has a thickness different from the non-magnetic first conductive layer of the first layer stack, and
the second ferromagnetic layer includes:
   a fourth ferromagnetic layer provided between the first insulating layer and the non-magnetic first conductive layer and being in contact with the first insulating layer, and
   a fifth ferromagnetic layer provided between the fourth ferromagnetic layer and the non-magnetic first conductive layer and having a crystal structure different from a crystal structure of the fourth ferromagnetic layer.

11. The device according to claim 10, wherein each of the non-magnetic first conductive layer of the first layer stack and the non-magnetic first conductive layer of the second layer stack has a thickness equal to or greater than 0.2 nm and equal to or smaller than 0.8 nm.

12. The device according to claim 10, wherein the first ferromagnetic layer of the first layer stack is antiferromagnetically coupled with the fifth ferromagnetic layer of the first layer stack.

13. A magnetoresistive memory device comprising:
first to n-th layer stacks, where n is a natural number equal to or greater than 2,
wherein:
a X-th layer stack is positioned above a (X-1)-th layer stack for all cases of X, where X is every natural number from 2 to n,
each of the first to n-th layer stacks includes:
   a first ferromagnetic layer having a magnetization directed in a first direction,
   a non-magnetic first conductive layer above the first ferromagnetic layer,
   a second ferromagnetic layer provided above the non-magnetic first conductive layer and having a magnetization directed in a second direction different from the first direction,
   a first insulating layer on an upper surface of the second ferromagnetic layer, and
   a third ferromagnetic layer above the first insulating layer, and
for each of all cases of X being 2 to n, the non-magnetic first conductive layer of the X-th layer stack is thicker than the non-magnetic first conductive layer of the (X-1)-th layer stack, or
for each of all cases of X being 2 to n, the non-magnetic first conductive layer of the X-th layer stack is thinner than the non-magnetic first conductive layer of the (X-1)-th layer stack.

14. The device according to claim 13, wherein the second ferromagnetic layer includes:
   a fourth ferromagnetic layer provided between the first insulating layer and the non-magnetic first conductive layer and being in contact with the first insulating layer, and
   a fifth ferromagnetic layer provided between the fourth ferromagnetic layer and the non-magnetic first conductive layer and having a crystal structure different from a crystal structure of the fourth ferromagnetic layer.

15. The device according to claim 14, wherein the non-magnetic first conductive layer of each of the first to n-th layer stacks has a thickness equal to or greater than 0.2 nm and equal to or smaller than 0.8 nm.

16. The device according to claim 14, wherein the first ferromagnetic layer of the X-th layer stack is antiferromagnetically coupled with the fifth ferromagnetic layer of the X-th layer stack for all cases of X, where X is every natural number from 2 to n.

17. The device according to claim 13, wherein the non-magnetic first conductive layer of each of the first to n-th layer stacks has a thickness equal to or greater than 0.2 nm and equal to or smaller than 0.8 nm.

* * * * *